United States Patent
Huang (10) Patent No.: US 12,512,803 B2
(45) Date of Patent: Dec. 30, 2025

(54) ACOUSTIC WAVE DEVICE AND MANUFACTURING METHOD THEREOF

(71) Applicant: RichWave Technology Corp., Taipei (TW)

(72) Inventor: Hao-Min Huang, Taipei (TW)

(73) Assignee: RichWave Technology Corp., Taipei (TW)

(*) Notice: Subject to any disclaimer, the term of this patent is extended or adjusted under 35 U.S.C. 154(b) by 195 days.

(21) Appl. No.: 18/506,152

(22) Filed: Nov. 10, 2023

(65) Prior Publication Data

US 2024/0305260 A1 Sep. 12, 2024

Related U.S. Application Data

(60) Provisional application No. 63/451,231, filed on Mar. 10, 2023.

(30) Foreign Application Priority Data

Oct. 18, 2023 (TW) .................................. 112139700

(51) Int. Cl.
*H03H 3/08* (2006.01)
*H03H 9/25* (2006.01)

(52) U.S. Cl.
CPC .............. *H03H 3/08* (2013.01); *H03H 9/25* (2013.01)

(58) Field of Classification Search
CPC ............ H03H 3/02; H03H 9/25; H03H 9/059; H03H 3/08
See application file for complete search history.

(56) References Cited

U.S. PATENT DOCUMENTS

2003/0025422 A1* 2/2003 Watanabe .......... H03H 9/02992
310/348
2005/0255824 A1 11/2005 Nakamura
2007/0267942 A1 11/2007 Matsumoto
(Continued)

FOREIGN PATENT DOCUMENTS

| CN | 107005219 A | 8/2017 |
| CN | 113922782 A | 1/2022 |
| CN | 115296642 A | 11/2022 |

OTHER PUBLICATIONS

Office action mailed on Apr. 11, 2024 for the Taiwan application No. 112139700, filing date Oct. 18, 2023, pp. 1-5.

*Primary Examiner* — Quan Tra
(74) *Attorney, Agent, or Firm* — Winston Hsu (57) ABSTRACT

A manufacturing method of an acoustic wave device and an acoustic wave device are provided. The manufacturing method includes providing a piezoelectric substrate. A transducer and a solder layer are provided on the piezoelectric substrate, and the transducer is covered with a passivation layer. The method further includes forming a first photoresist layer on the piezoelectric substrate, and patterning the first photoresist layer to form a first patterned photoresist layer. The first patterned photoresist layer covers an upper surface of the passivation layer and exposes an upper surface of the solder layer. The method further includes forming a metal layer on the upper surface of the solder layer and the first patterned photoresist layer, and stripping the first patterned photoresist layer.

16 Claims, 6 Drawing Sheets

(56) References Cited

U.S. PATENT DOCUMENTS

| | | | |
|---|---|---|---|
| 2011/0018389 A1* | 1/2011 | Fukano | H03H 9/1092 |
| | | | 29/25.35 |
| 2016/0190423 A1* | 6/2016 | Tsubokawa | H10N 30/06 |
| | | | 29/25.35 |
| 2019/0288665 A1* | 9/2019 | Hatsuda | H03F 3/245 |
| 2020/0294947 A1 | 9/2020 | Otsuka | |
| 2021/0013865 A1* | 1/2021 | Shih | H03H 3/08 |
| 2021/0344323 A1 | 11/2021 | Ebner | |
| 2022/0302898 A1 | 9/2022 | Adhikari | |
| 2023/0008078 A1 | 1/2023 | Weng | |
| 2023/0070350 A1 | 3/2023 | Goto | |

\* cited by examiner

ACOUSTIC WAVE DEVICE AND MANUFACTURING METHOD THEREOF

CROSS REFERENCE TO RELATED APPLICATION

This application claims the benefit of U.S. Provisional Application No. 63/451,231, filed on Mar. 10, 2023, and Taiwan Patent Application No. 112139700, filed on Oct. 18, 2023. The entire content of the applications are incorporated herein by reference.

TECHNICAL FIELD

The present invention is related to an acoustic wave device and its manufacturing method, and more particularly to a surface acoustic wave (SAW) device and its manufacturing method.

BACKGROUND

Surface acoustic wave (SAW) devices may be used to convert and transceive electrical and/or acoustic signals and therefore may be widely used in many fields. For example, SAW devices may be used to configure SAW filters, which may filter out noises from wireless signals so as to achieve a desired band of frequency resulting in advantages such as lower transmission loss, stronger ability to avoid interference from electromagnetic, and/or a compact size. In addition, SAW devices may also be implemented in resonators.

The SAW device may be boned or assembled into the package by using a flip chip process. The SAW device may include a piezoelectric substrate, an interdigital transducer (IDT) disposed on the piezoelectric substrate, and a solder layer (e.g., also referenced as a solder pad) electrically connected to the IDT. Solder bumps may be formed on the solder layer, and the material for the solder bump may include tin, lead or other suitable metal materials. With these solder bumps, the solder layer of the SAW device may be connected to various components of a package, for example, an input solder layer, an output solder layer and/or a grounding solder layer.

Electroplating or chemical plating processes may be used to form the connections (e.g., copper pillars) of the SAW device. In such a process, various solutions may be used and they may adversely cause corrosion or other effects on components of the SAW device (e.g., IDT). Traditionally, SAW devices may be configured with protective walls and/or top covers to form an air cavity in which the IDT may be located. The IDT located in the cavity may be isolated by the protective walls and top covers from various solutions used during an electroplating process. However, protective walls and/or top covers may increase the size and cost of the SAW device, which is adversely for circuit miniaturization.

SUMMARY

An embodiment of the disclosure provides a manufacturing method of an acoustic wave device. The method includes providing a piezoelectric substrate. A transducer and a solder layer are provided on the piezoelectric substrate, and the transducer is covered with a passivation layer. The method further includes forming a first photoresist layer on the piezoelectric substrate, and patterning the first photoresist layer to form a first patterned photoresist layer. The first patterned photoresist layer covers an upper surface of the passivation layer and exposes an upper surface of the solder layer. The method further includes forming a metal layer on the upper surface of the solder layer and the first patterned photoresist layer, and stripping the first patterned photoresist layer.

An embodiment of the disclosure provides an acoustic wave device. The device includes a piezoelectric substrate including a first surface, a transducer provided on the first surface of the piezoelectric substrate, a solder layer provided on the first surface of the piezoelectric substrate and electrically connected to the transducer, a passivation layer provided on the transducer, and a stack provided on the solder layer. The passivation layer is provided in an open space.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
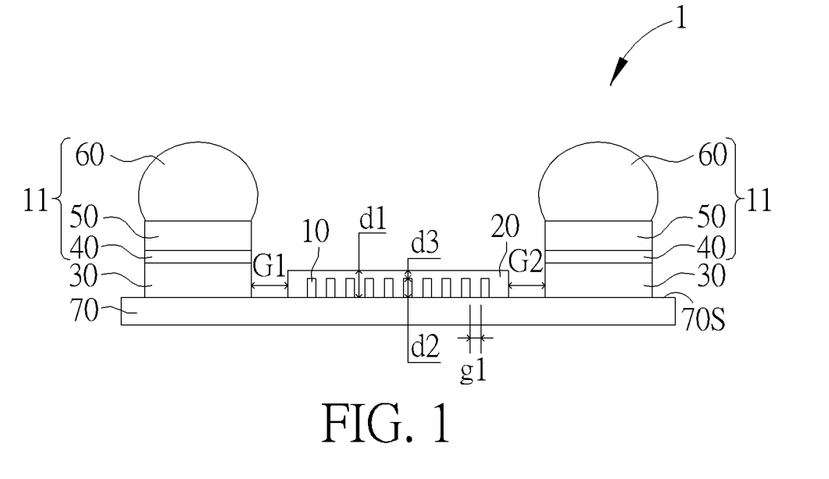
FIG. 1 is a schematic cross-sectional view of an acoustic wave device according to an embodiment of the present invention.

FIG. 1 is a schematic cross-sectional view of an acoustic wave device 1 according to an embodiment of the present invention. The acoustic wave device 1 may be, for example, a surface acoustic wave (SAW) device. In some embodiments, the acoustic wave device 1 may receive a radio frequency (RF) signal from an antenna, convert the radio frequency signal into an acoustic wave, process the acoustic wave to generate a filtered signal, and output the filtered signal. The RF signal and the filtered signal may be electrical signals. This is merely an exemplary application for the acoustic wave device 1 and the present invention is not limited thereto. In other embodiments, the acoustic wave device 1 may also be implemented for other applications.

In some embodiments, the acoustic wave device 1 may include a piezoelectric substrate 70, a transducer 10, at least one solder layer 30, a passivation layer 20, and a stack 11. The solder layer 30 may be electrically connected to the transducer 10. During the manufacturing process of the acoustic wave device 1, for example, before an electroplating process, the transducer 10 may be covered with a passivation layer 20 and a photoresist layer to protect the transducer 10 from being contaminated or corroded by various chemical solutions. When electroplating is completed, the photoresist layer may be removed and the passivation layer 20 may remain on the transducer 10. The acoustic wave device 1 may have a reduced weight, a reduced circuit size, lower manufacturing costs, and/or enhanced performance. In some embodiments, the footprint of the acoustic wave device 1 may be, for example, 1.1 mm×0.9 mm (millimeter).

In some embodiments, the piezoelectric substrate 70 may include a surface 70S. The transducer 10 and the solder layer 30 may be disposed on the surface 70S of the piezoelectric substrate 70. For example, the transducer 10 may include an interdigital transducer (IDT), which may at least includes an input finger and an output finger. In some embodiments, the input finger and the output finger may be referenced as a finger pair. The input finger and the output finger may be disposed adjacently without directly contacting. For example, a gap g1 may exist between an input finger and an output finger. The passivation layer 20 may be disposed to cover on the transducer 10. In some embodiments, the passivation layer 20 may be disposed in an open space, that is a non-enclosed or non-sealed space). For example, the passivation layer 20 is not disposed in a protective cavity.

As shown in FIG. 1, the transducer 10 may have a thickness d2 ranging from 1000 Å (angstrom) to 1500 Å. Corresponding to the position of a finger of the transducer 10, the passivation layer 20 may have a thickness d3 between 200 Å and 300 Å. In addition, corresponding to a gap between two fingers of the transducer 10, the passivation layer 20 may have a thickness d1. As shown in FIG. 1, the thickness d1 may be greater than the thickness d3, but the invention is not limited thereto. In some embodiments, the passivation layer 20 may be conformally formed on the transducer 10, i.e., formed according to the shape of the transducer 10. In such a case, the thickness d1 may be substantially equal to the thickness d3. The passivation layer 20 may include materials such as silicon oxide (e.g., silicon dioxide) and silicon nitride. In the above example, the input finger and the output finger are merely for illustration and are not to limit the functions of each finger. That is, the input finger may also be used for output, and/or the output finger may also be used for input.

In some embodiments, the solder layer 30 is electrically connected to the transducer 10 for transmitting radio frequency signals to the transducer 10, and/or receiving filtered signals from the transducer 10. In some embodiments, the transducer 10 and the solder layer 30 may include identical metals or different metals. For example, the transducer 10 and/or the solder layer 30 may include molybdenum (Mo), copper (Cu), aluminum (Al), gold (Au), platinum (Pt), tungsten (W), nickel (Ni), silver (Ag), tantalum (Ta), another suitable material and a combination thereof. In addition, the transducer 10 and the solder layer 30 may be formed during one process, or be formed respectively by different processes. As shown in FIG. 1, gaps G1 and G2 may be formed between the passivation layer 20 and the solder layer 30. However, in other non-illustrated embodiments, gaps G1 or G2 between the passivation layer 20 and the solder layer 30 may be omitted, that is, the passivation layer 20 may be in contact with the solder layer 30.

In some embodiments, the piezoelectric substrate 70 may be a single-layer structure, which may include at least one of the following piezoelectric materials: zinc oxide (ZnO), aluminum nitride (AlN), lithium tantalate (LiTaO$_3$, LT), lithium niobate (LN), quartz (QZ), lead titanate (PTO), lead zirconate titanate (PZT), another suitable material and a combination thereof. In other embodiments, the piezoelectric substrate 70 may be a multi-layer structure, which may include a base layer and a piezoelectric layer disposed on the base layer. The base layer may include materials such as silicon, and the piezoelectric layer may include at least one of the above-mentioned piezoelectric materials. In further some embodiments, the piezoelectric material may also include piezoelectric single crystals, piezoelectric polycrystals (including piezoelectric ceramics), piezoelectric polymers, and/or piezoelectric composite materials.

In some embodiments, the stack 11 may be disposed on the solder layer 30. The stack 11 may include a seed layer 40, a metal layer 50, and a solder bump 60 stacked sequentially. In some embodiments, the seed layer 40 may be omitted, such that the metal layer 50 is directly formed on the solder layer 30. For example, the seed layer 40 may include materials such as titanium (Ti), nickel (Ni) or an alloy thereof. The metal layer 50 may include materials such as copper (Cu), aluminum (Al), nickel (Ni), tin (Sn), silver (Ag) or an alloy thereof. The solder bumps 60 may include materials such as tin (Sn) or lead (Pb). In some embodiments, the thickness of metal layer 50 may be greater than the thickness of seed layer 40. In some embodiments, the metal layer 50 may be referred to as under-bump metallization (UBM).

Figure 2:
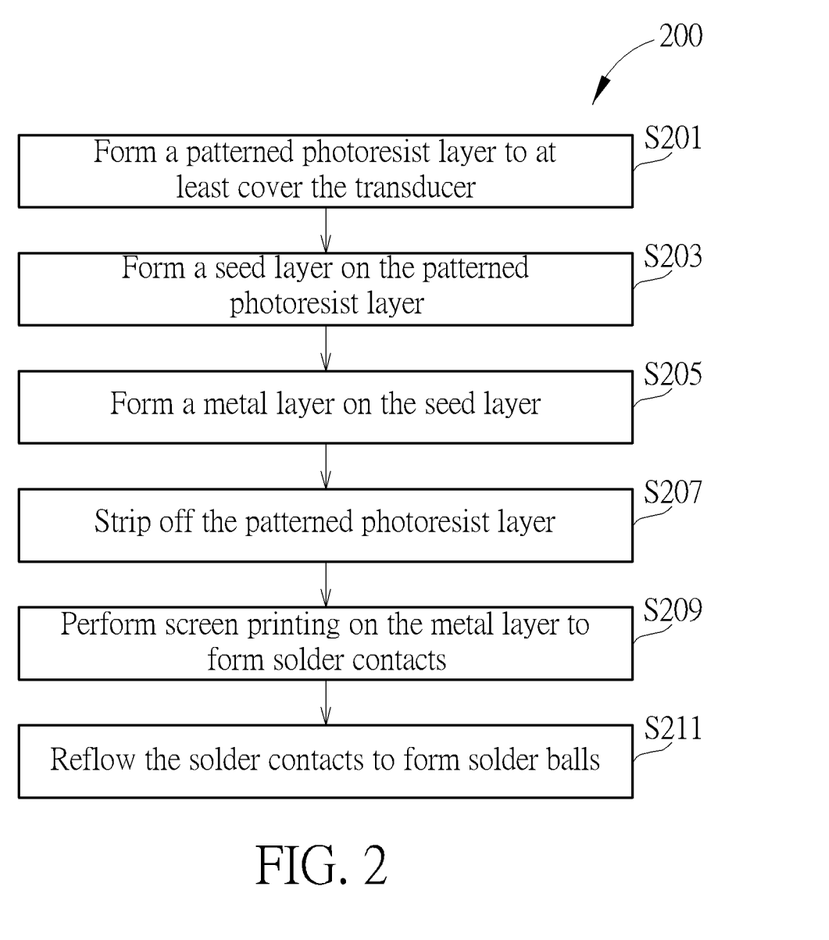
FIG. 2 is a schematic flowchart of a manufacturing method according to an embodiment of the present invention.

FIG. 2 is a schematic flowchart of a manufacturing method 200 according to an embodiment of the present invention. The manufacturing method 200 includes steps S201 to S211. During step S201, a patterned photoresist layer is formed on the transducer, so as to at least cover the transducer. During steps S203 and S205, a seed layer and a metal layer are formed respectively. During step S207, the patterned photoresist layer may be stripped. During steps S209 and S211, solder bumps may be formed sequentially. Any reasonable technical changes or step adjustments may fall within the scope of the present invention. Steps S201 to S211 may be further detailed as follows:

S201: Form a patterned photoresist layer to at least cover the transducer;

S203: Form a seed layer on the patterned photoresist layer;

S205: Form a metal layer on the seed layer;

S207: Strip off the patterned photoresist layer;

S209: Perform a screen printing process on the metal layer to form solder contacts; and S211: Reflow the solder contacts to form solder bumps.

A schematic manufacturing method 200 is further described below with reference to FIG. 3 to FIG. 8.

Figure 3:
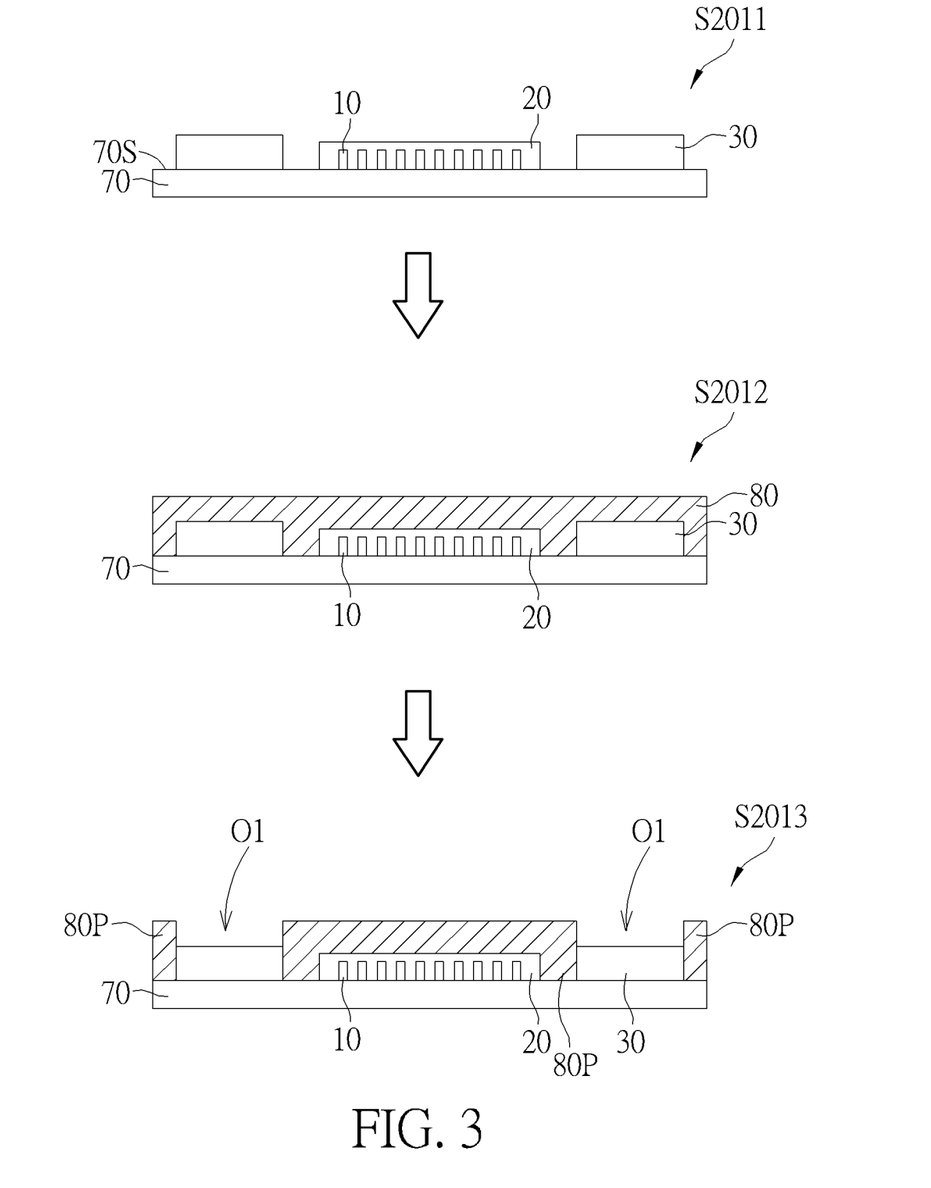
FIG. 3 to FIG. 8 schematically depict various steps of a manufacturing process according to at least one embodiment of the present invention.

FIG. 3 schematically depicts step S201. Step S201 may include steps S2011 to S2013. At step S2011, a piezoelectric substrate 70 is provided, and the transducer 10 and the solder layer 30 are formed on the surface 70S of the piezoelectric substrate 70. The solder layer 30 may electrically connect the transducer 10. The transducer 10 is covered with a passivation layer 20. In some embodiments, the passivation layer 20 may protect the transducer 10 from particles and solutions. At step S2012, a first photoresist layer 80 is formed to at least cover the transducer 10. In the embodiment, the first photoresist layer 80 covers the transducer 10, the passivation layer 20 and the solder layer 30 on the piezoelectric substrate 70. In some embodiments, the first photoresist layer 80 may be formed by coating and/or baking processes. Then, at step S2013, the first photoresist layer 80 is patterned to form a first patterned photoresist layer 80p. The first patterned photoresist layer 80p exposes the upper surface of the solder layer 30. In detail, the first patterned photoresist layer 80p may include at least one first opening O1, and the upper surface of the solder layer 30 may be exposed from the first opening O1. In some embodiments, the first photoresist layer 80 may be patterned by a photolithography process. For example, the first patterned photoresist layer 80 may comprise a positive photoresist material or a negative photoresist material. Taking the positive photoresist material as an example, the positive photoresist material on the solder layer 30 may be removed after irradiation (for example, irradiated with an ultraviolet light, a deep ultraviolet light, an electron beam, an ion beam or X-ray), so as to form a first opening O1. Thus, by means of step S201, a patterned photoresist layer 80p may be formed, and it may cover at least on the transducer 10, that is, covering on the passivation layer 20 on the transducer 10.

Figure 4:
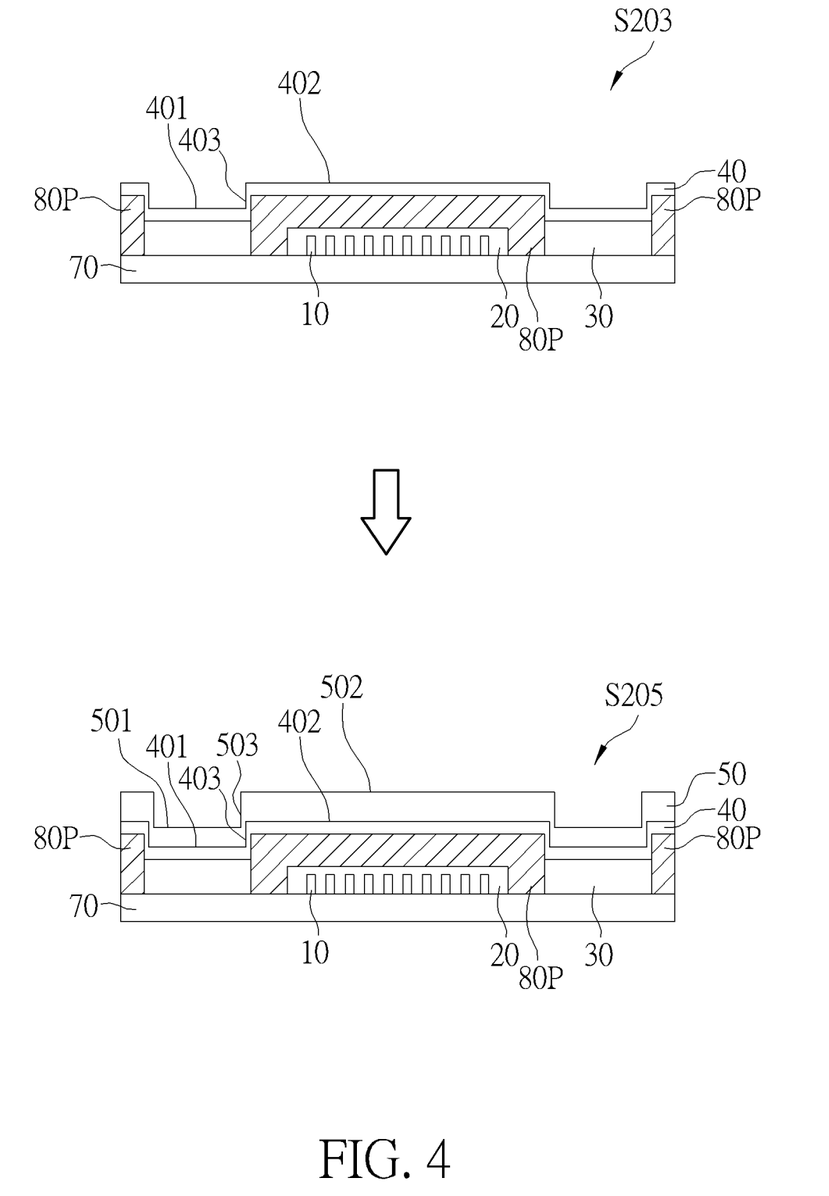

FIG. 4 schematically depicts steps S203 and S205. After step S201, a seed layer 40 is formed on the upper surface of the solder layer 30 and on the first patterned photoresist layer 80p (step S203). As shown in FIG. 4, the seed layer 40 may include a first portion 401 and a second portion 402 horizontally extended. The first portion 401 is formed on the upper surface of the solder layer 30, and the second portion 402 is formed on an upper surface of the first patterned photoresist layer 80p. The seed layer 40 may be used to provide a better surface for the metal layer 50 formed subsequently and further, the seed layer 40 may be configured for providing an increased thickness. In some embodiments, the seed layer 40 may be formed by a sputter deposition process, and may be provided for better conductivity with respect to a subsequent electroplating process. In some embodiments, the seed layer 40 may further include a third portion 403 vertically extended and the third portion 403 may be formed on sidewalls of the first patterned photoresist layer 80p. For example, a sidewall of the first patterned photoresist layer 80p may be partially adjacent to a sidewall of the solder layer 30. In some embodiments, the third portion 403 of the seed layer 40 may be thinner than the first portion 401, and further thinner than the second portion 402. In some embodiments, the seed layer 40 may not include the third portion 403, that is, the seed layer 40 may not be formed on the sidewall of the first patterned photoresist layer 80p. Thus, by ways of step S203, the seed layer 40 is formed on the patterned photoresist layer 80p.

After step S203, as shown in FIG. 4, a metal layer 50 is formed on the seed layer 40 (step S205). The metal layer 50 may include a first portion 501 and a second portion 502 horizontally extended. The first portion 501 may be formed on the first portion 401 of the seed layer 40, and a second portion 502 may be formed on the second portion 402 of the seed layer 40. In some embodiments, the metal layer 50 may be formed by processes such as evaporation, sputtering, electroplating or chemical plating. In some embodiments, the metal layer 50 may further include a third portion 503 vertically extended, which may be formed on the third portion 403 of the seed layer 40. In some embodiments, the third portion 503 of the metal layer 50 is thinner than the first portion 501 and the second portion 502. In some embodiments, the metal layer 50 may not include the third portion 503, that is, the metal layer 50 may not be formed on the third portion 403 of the seed layer 40. Thus, by ways of step S205, the metal layer 50 is formed on the seed layer 40.

It should be noted that terms "upper", "lower" "on", "above" or "below" in this article are not limited to the positional relationship in a horizontal direction, and may also include a positional relationship in a vertical direction.

As mentioned above, in some embodiments, step S203 may be omitted, that is, step S205 is performed immediately after step S201, thereby forming the metal layer 50 on the upper surface of the solder layer 30 and on the first patterned photoresist layer 80p. During the process of forming the seed layer 40 and/or the metal layer 50, at least one electrolyte solution may be used. Since the transducer 10 is covered by the first patterned photoresist layer 80p and the passivation layer 20, it may be protected or isolated from the electrolyte solution. In other words, the first patterned photoresist layer 80p may be used to protect the transducer 10 from contamination or corrosion resulted from the electrolyte solution.

Figure 5:
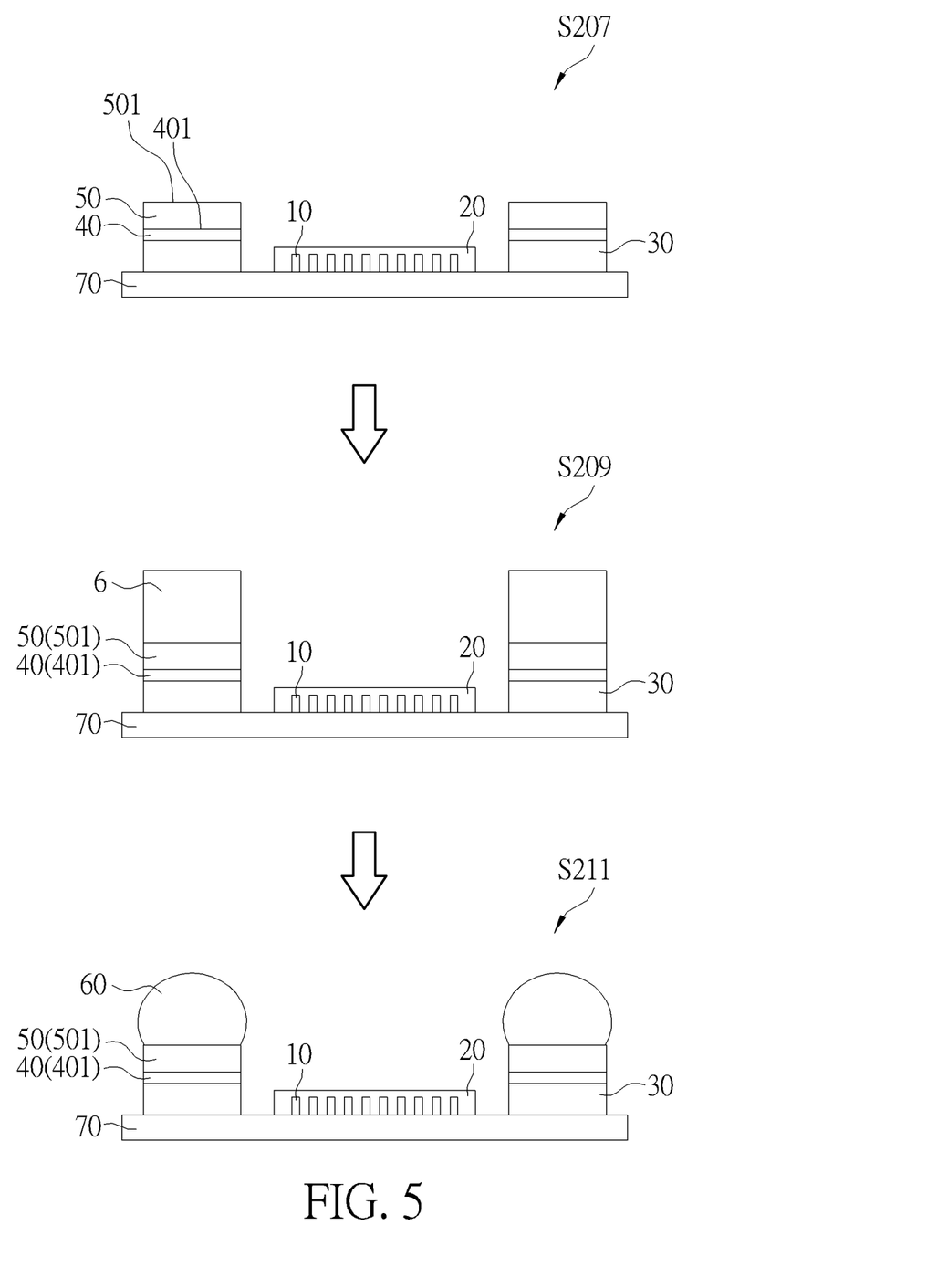

FIG. 5 schematically depicts steps S207 to S211. After step S205, as shown in FIG. 5, at least one portion of the first patterned photoresist layer 80p is removed by a strip-off or lift-off process at step S207. In the embodiment, both the second portion 402 of the seed layer 40 and the second portion 502 of the metal layer 50 formed on the first patterned photoresist layer 80p may be substantially removed where a major portion is moved while a minor portion may be retained. In addition, the first portion 401 of the seed layer 40 and the first portion 501 of the metal layer 50 may be retained on the solder layer 30. In detail, compared with the adhesion strength between the photoresist layer 80p and the passivation layer 20, and/or compared with the adhesion strength between the photoresist layer 80p and the piezoelectric substrate 70, a stronger adhesion may exist between the first portion 401 of the seed layer 40 and the solder layer 30. In other words, the adhesion strength between the first portion 401 of the seed layer 40 and the solder layer 30 may be greater than the adhesion strength between the photoresist layer 80p and the passivation layer 20, and may also be greater than the adhesion strength between the photoresist layer 80p and the piezoelectric substrates 70. Thus, at step S207, the third portion 403 of the seed layer 40 and/or the third portion 503 of the metal layer 50 may also be substantially removed.

In some embodiments, step S207 may be performed by using a high-pressure stripping machine. For example, a high-pressure stripping machine may include a processing tank, an ultrasonic equipment, and a high-pressure spraying structure. For example, the piezoelectric substrate 70 (with various layers thereon) may be placed in the processing tank, processed with ultrasonic treatment, and sprayed with a high-pressure spraying solvent by the high-pressure spraying equipment. As a result, the patterned photoresist layer 80p, the seed layer 40 and the metal layer 50 thereon may be substantially removed. The above example is merely for illustration purpose and is not intended to limit the present invention. In other cases, step S207 may also be performed by other types of stripping machine.

In some embodiments, the third portion 403 (if present) of the seed layer 40 and the third portion 503 (if present) of the metal layer 50 are thinner, and thus may be fractured more easily. Therefore, when using a high-pressure spraying solvent during step S207, the patterned photoresist layer 80p on the transducer 10 may be removed via the fractured third portion 403 of the seed layer 40 and the fractured third portion 503 of the metal layer 50, with the second portion 402 of the seed layer 40 and the second portion 502 of the metal layer 50 on the patterned photoresist layer 80p being also removed. After step S207, the passivation layer 20 may be retained on the transducer 10. In some additional embodiments, during and/or after step 207, a cleaning step may optionally be performed by plasma. Thus, by ways of the step S207, the first patterned photoresist layer 80p is stripped off.

Next, as shown in FIG. 5, at step S209, a screen printing process (also referred to as print screen) is performed on the metal layer 50 (e.g., on the first portion 501 of the metal layer 50) to form solder contacts 6. Then, at step S211, the solder contacts 6 are reflowed to form solder bumps 60. The solder bumps 60s may be a metal tin ball, for example. In some embodiments, the first portion 401 of the seed layer 40, the first portion 501 of the metal layer 50 and the solder bumps 60 disposed on the solder layer 30 may be referred to as the stack 11. Thus, by ways of steps S209 and S211, the solder bumps 60 may be formed.

Figure 6:
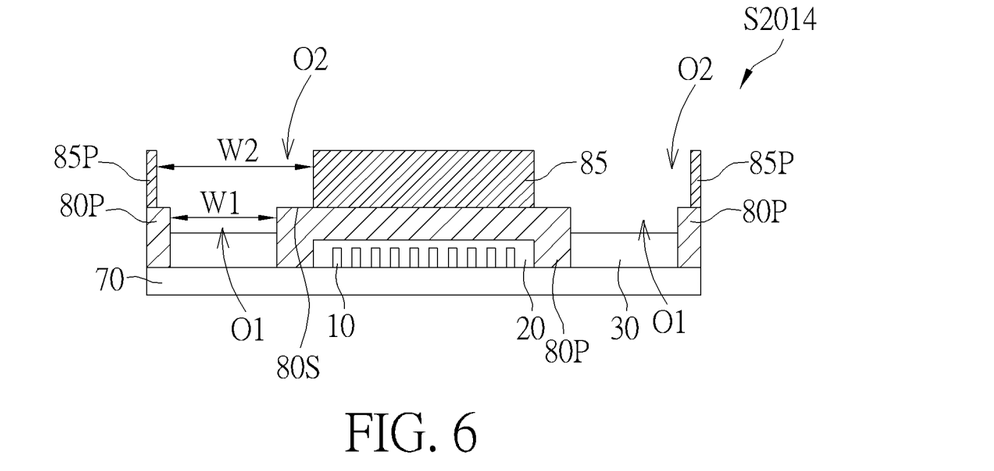

In some embodiments, step S201 may additionally include step S2014. As shown in FIG. 6, a second patterned photoresist layer 85*p* may be formed on the first patterned photoresist layer 80*p* (step S2014). The patterned photoresist layer 85*p* exposes an upper surface of the solder layer 30. The formation of the second patterned photoresist layer 85*p* may be similar to that of the first patterned photoresist layer 80*p* (e.g., step S2012 and step S2013). In some embodiments, the step of forming the second patterned photoresist layer 85*p* may include: forming a second photoresist layer 85, and then patterning the second photoresist layer 85 to form a patterned second patterned photoresist layer 85*p*.

In some embodiments, the second photoresist layer 85 may be formed after step S2012 (forming the first photoresist layer 80, refer to FIG. 3). Then the first photoresist layer 80 and the second photoresist layer 85 may be patterned to form the first patterned photoresist layer 80*p* and the second patterned photoresist layer 85*p* respectively. In this embodiment, the first photoresist layer 80 may be patterned by a first photolithography process, and the second photoresist layer 85 may be patterned by a second photolithography process. In other embodiments, the second photoresist layer 85 and the first photoresist layer 80 may be patterned simultaneously. For example, the first photoresist layer 80 and the second photoresist layer 85 may be patterned by the same photolithography process.

In other embodiments, the second photoresist layer 85 may be formed after step S2013 (forming the first patterned photoresist layer 80*p*, refer to FIG. 3). Then, the second photoresist layer 85 may be patterned to form the second patterned photoresist layer 85*p*.

As shown in FIG. 6, the second patterned photoresist layer 85*p* may include at least one second opening O2, and an upper surface of the solder layer 30 may be exposed from the second opening O2. In some embodiments, the second opening O2 may be substantially aligned with the first opening O1. For example, the second opening O2 may partially overlap the first opening O1 in a direction perpendicular to the surface of the piezoelectric substrate 70. The second opening O2 may be disposed above the first opening O1, and a width W2 of the second opening O2 may be greater than a width W1 of the first opening O1, such that a step 80S is formed at the joint between the first patterned photoresist layer 80*p* and the second patterned photoresist layer 85*p*. However, the present invention is not limited thereto. In other embodiments, the width W2 of the second opening O2 may be equal to the width W1 of the first opening O1, such that no step 80S is formed at the joint of the first and the second patterned photoresist layer 80*p*, 85*p*. The total thickness of the first and the second patterned photoresist layer 80*p*, 85*p* may be ranged from 20 to 30 μm. In this embodiment, the combination of the first and the second patterned photoresist layer 80*p*, 85*p* may be configured for providing an increased thickness, such that the seed layer formed in the subsequent step S203 may include a thinner vertical portion (e.g., a thinner third portion 403), which may be beneficial for the subsequent step S207.

Figure 7:
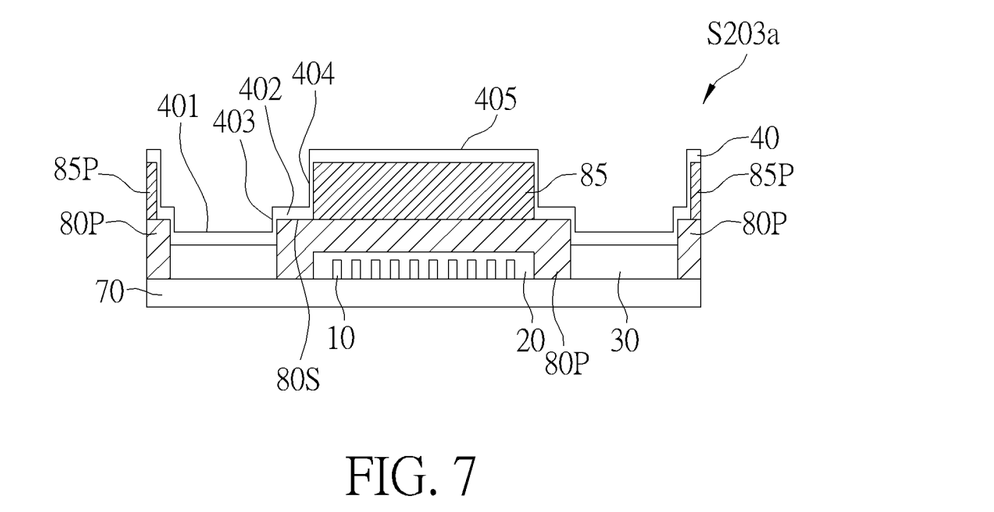
Figure 8:
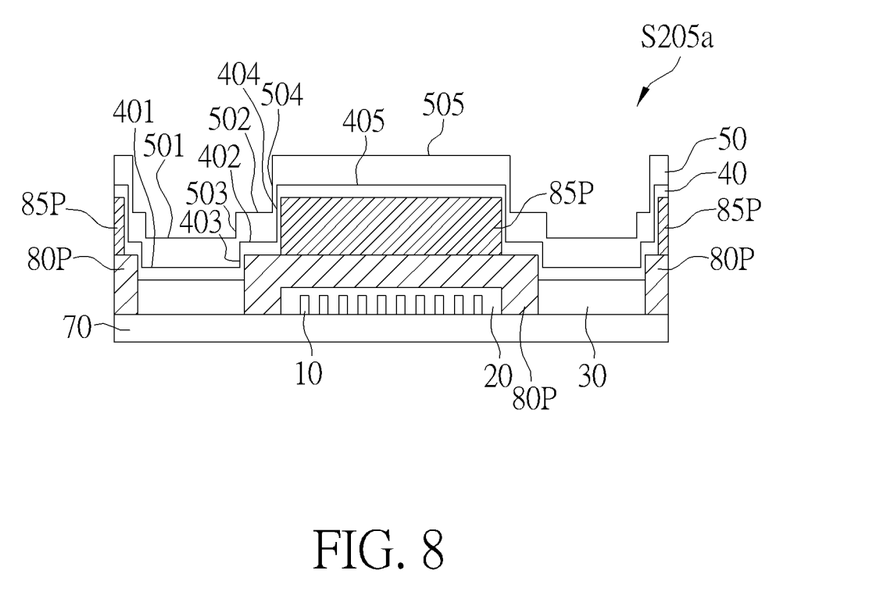

Similar to step S203 and step S205, FIG. 7 and FIG. 8 schematically depict step S203*a* and step S205*a* respectively.

At step S203*a*, a seed layer 40 is formed on the upper surface of the solder layer 30 and on the second patterned photoresist layer 85*p*. As shown in FIG. 7, the seed layer 40 may be further formed on the step 80S (if present). In more detail, the seed layer 40 may include a first portion 401, a second portion 402, a third portion 403, a fourth portion 404 and a fifth portion 405. The first portion 401 may extend horizontally and may be formed on the upper surface of the solder layer 30. The second portion 402 may extend horizontally and may be formed on the step 80S (i.e., on a upper surface of the first patterned photoresist layer 80*p*). The third portion 403 may extend vertically and may be formed on a sidewall of the step 80S (i.e., on a sidewall of the first patterned photoresist layer 80*p*). The fourth portion 404 may extend vertically and may be formed on a sidewall of the second patterned photoresist layer 85*p*. The fifth portion 405 may extend horizontally and may be formed on an upper surface of the second patterned photoresist layer 85*p*. In some embodiments, with the various portions of the seed layer 40, the vertically extended portions (e.g., the third portion 403, and/or the fourth portion 404) may be thinner compared to the horizontally extended portions (e.g., the first portion 401, the second portion 402, and/or the fifth portion 405). For example, the third portion 403 may be thinner than the first portion 401 and the second portion 402. The fourth portion 404 may be thinner than the second portion 402 and the fifth portion 405. In some embodiments, the seed layer 40 may not include the third portion 403 and/or the fourth portion 404.

At step S205*a*, the metal layer 50 may be formed on the seed layer 40. As shown in FIG. 8, the metal layer 50 may include a first portion 501, a second portion 502, a third portion 503, a fourth portion 504 and a fifth portion 505, which are respectively formed on the first portion 401, the second portion 402, the third portion 403, the fourth portion 404, and the fifth portion 405 of the seed layer 40. Similarly, the third portion 503 of the metal layer 50 may be thinner than the first portion 501 and the second portion 502. The fourth portion 504 of the metal layer 50 may be thinner than the second portion 502 and the fifth portion 505. In some embodiments, the metal layer 50 may not include the third portion 503 and/or the fourth portion 504.

In some embodiments, step S203*a* may be omitted, that is, step S205*a* may be performed directly after step S201, so as to form the metal layer 50 on the upper surface of the solder layer 30 and on the second patterned photoresist layer 85*p*.

As mentioned above, the combination of the first and the second patterned photoresist layer 80*p*, 85*p* may be configured for providing an increased thickness, so that the seed layer 40 and the metal layer 50 formed subsequently may each have thinner vertical portions. Thinner vertical portions may be fractured easily. Thus, the high-pressure spraying solvent used at step S207 may reach and remove the first and/or second patterned photoresist layer 80*p*, 85*p* more easily through the fractured vertical portion.

According to embodiments of the present invention, the acoustic wave device 1 may be manufactured in a simple and cost-effective manner. For example, during the step of forming the metal layer 50 (e.g., step S205), the first patterned photoresist layer 80*p* may cover on the passivation layer 20 and the transducer 10, so that the transducer 10 may be isolated from the electrolyte solution without being contaminated or corroded. In addition, during the strip-off (or lift-off) process, the first patterned photoresist layer 80*p* may be removed, and the passivation layer 20 may be retained on the transducer 10 to protect the transducer 10 from damage caused by the strip-off (or lift-off) process. Thus, the transducer 10 may maintain an ideal shape or size, and thus the performance of the acoustic wave device 1 may be maintained or improved, such as the quality factor and/or a target frequency. In other words, without the passivation layer 20, the shape and/or the size of the transducer 10 may be changed due to the strip-off process, causing a frequency shift from the target frequency. Further, the second patterned photoresist layer 85p may be additionally or optionally formed on the first patterned photoresist layer 80p, and with the increased total thickness provided by the combination thereof, the subsequent strip-off process may be performed more easily, and/or a better yield may be achieved.

According to the embodiment of the present invention, an acoustic wave device may be manufactured without protective walls or top covers. This is beneficial for miniaturization of an acoustic wave device and simplification of the manufacturing method. Furthermore, an acoustic wave device according to the present invention may have a more precise operating frequency. Therefore, various embodiments of the present invention may provide a cost-effective and compact acoustic wave device with better performances.

Those skilled in the art will readily observe that numerous modifications and alterations of the device and method may be made while retaining the teachings of the invention. Accordingly, the above disclosure should be construed as limited merely by the metes and bounds of the appended claims.

What is claimed is:

1. A manufacturing method of an acoustic wave device comprising:
    providing a piezoelectric substrate, wherein a transducer and a solder layer are provided on the piezoelectric substrate, and the transducer is covered with a passivation layer;
    forming a first photoresist layer on the piezoelectric substrate;
    patterning the first photoresist layer to form a first patterned photoresist layer, wherein the first patterned photoresist layer covers an upper surface of the passivation layer and exposes an upper surface of the solder layer;
    forming a metal layer on the upper surface of the solder layer and the first patterned photoresist layer; and
    stripping the first patterned photoresist layer from the passivation layer.

2. The manufacturing method of claim 1 further comprising:
    prior to forming the metal layer, forming a seed layer on the upper surface of the solder layer and the first patterned photoresist layer, wherein the seed layer comprises a first portion formed on the upper surface of the solder layer and a second portion formed on an upper surface of the first patterned photoresist layer; and
    wherein the metal layer is formed on the seed layer, and the metal layer comprises:
        a first portion formed on the first portion of the seed layer; and
        a second portion formed on the second portion of the seed layer.

3. A manufacturing method of an acoustic wave device comprising:
    providing a piezoelectric substrate, wherein a transducer and a solder layer are provided on the piezoelectric substrate, and the transducer is covered with a passivation layer;
    forming a first photoresist layer on the piezoelectric substrate;
    patterning the first photoresist layer to form a first patterned photoresist layer, wherein the first patterned photoresist layer covers an upper surface of the passivation layer and exposes an upper surface of the solder layer;
    forming a seed layer on the upper surface of the solder layer and the first patterned photoresist layer, wherein the seed layer comprises:
        a first portion formed on the upper surface of the solder layer,
        a second portion formed on an upper surface of the first patterned photoresist layer; and
        a third portion formed on a sidewall of the first patterned photoresist layer, the third portion of the seed layer is thinner than the first portion of the seed layer and the second portion of the seed layer;
    forming a metal layer on the seed layer, wherein the metal layer comprises:
        a first portion formed on the first portion of the seed layer;
        a second portion formed on the second portion of the seed layer; and
        a third portion formed on the third portion of the seed layer, wherein the third portion of the metal layer is thinner than the first portion of the metal layer and the second portion of the metal layer; and
    stripping the first patterned photoresist layer.

4. The manufacturing method of claim 2, wherein the step of stripping the first patterned photoresist layer comprises:
    performing a striping process by using a high-pressure stripping machine to remove at least part of the first patterned photoresist layer, wherein the second portion of the seed layer and the second portion of the metal layer are removed, and the first portion of the seed layer and the first portion of the metal layer are retained.

5. The manufacturing method of claim 1, wherein the first patterned photoresist layer comprises at least one first opening, and the at least one first opening exposes the upper surface of the solder layer.

6. The manufacturing method of claim 1, wherein the step of forming the metal layer comprises forming the metal layer by an electroplating process, wherein an electrolyte solution is used during the electroplating process, and during the electroplating process, the first patterned photoresist layer and the passivation layer are used to isolate the transducer from the electrolyte solution.

7. A manufacturing method of an acoustic wave device comprising:
    providing a piezoelectric substrate, wherein a transducer and a solder layer are provided on the piezoelectric substrate, and the transducer is covered with a passivation layer;
    forming a first photoresist layer on the piezoelectric substrate;
    forming a second photoresist layer on the first photoresist layer;
    patterning the first photoresist layer to form a first patterned photoresist layer;
    patterning the second photoresist layer to form a second patterned photoresist layer; wherein the first patterned photoresist layer and the second patterned photoresist layer covers an upper surface of the passivation layer and exposes an upper surface of the solder layer;
    forming a metal layer on the upper surface of the solder layer and the second patterned photoresist layer; and
    stripping the first patterned photoresist layer.

8. The manufacturing method of claim 7, wherein:
    patterning the second photoresist layer is performed after patterning the first photoresist layer; or patterning the second photoresist layer is performed simultaneously with patterning the first photoresist layer.

9. The manufacturing method of claim 8, wherein:
the second patterned photoresist layer comprises at least one second opening, and the at least one second opening exposes the upper surface of the solder layer; and
the at least one second opening at least partially overlaps the at least one first opening in a vertical direction.

10. The method of claim 9, wherein the at least one second opening is formed above the at least one first opening and is wider than the at least one first opening, such that a step is formed at a joint between the first patterned photoresist layer and the second patterned photoresist layer.

11. The manufacturing method of claim 10 further comprises, prior to forming the metal layer, forming a seed layer, wherein the seed layer comprises:
a first portion formed on the upper surface of the solder layer;
a second portion formed on an upper surface of the first patterned photoresist layer;
a third portion formed on a sidewall of the first patterned photoresist layer;
a fourth portion formed on a sidewall of the second patterned photoresist layer; and
a fifth portion formed on an upper surface of the second patterned photoresist layer.

12. The manufacturing method of claim 11, wherein the step of stripping the first patterned photoresist layer comprises:
performing a stripping process by using a high-pressure stripping machine to remove at least one portion of the first patterned photoresist layer and at least one portion of the second patterned photoresist layer;
wherein the second portion of the seed layer and the fifth portion of the seed layer are removed, and the first portion of the seed layer is retained.

13. The manufacturing method of claim 7, wherein a total thickness of the first patterned photoresist layer and the second patterned photoresist layer is between 20 and 30 microns.

14. The manufacturing method of claim 1, wherein the step of providing the piezoelectric substrate comprises:
forming the transducer on a first surface of the piezoelectric substrate;
forming the solder layer on the first surface of the piezoelectric substrate, wherein the solder layer is electrically connected to the transducer;
forming the passivation layer on the transducer and the solder layer; and
patterning the passivation layer to expose the upper surface of the solder layer.

15. The manufacturing method of claim 14, wherein a gap is formed between the passivation layer and the solder layer.

16. The method of claim 1, further comprising:
performing a screen printing process on the metal layer to form a solder contact; and
reflowing the solder contact to form a solder bump.

* * * * *